United States Patent
Shibata

(10) Patent No.: US 7,915,959 B2
(45) Date of Patent: Mar. 29, 2011

(54) MULTI-PATH, MULTI-OXIDE-THICKNESS AMPLIFIER CIRCUIT

(75) Inventor: Hajime Shibata, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/399,485

(22) Filed: Mar. 6, 2009

(65) Prior Publication Data
US 2010/0225398 A1 Sep. 9, 2010

(51) Int. Cl.
*H03F 3/68* (2006.01)
(52) U.S. Cl. ........................... 330/295; 330/277
(58) Field of Classification Search .............. 330/124 R, 330/277, 295
See application file for complete search history.

(56) References Cited

U.S. PATENT DOCUMENTS

| | | | |
|---|---|---|---|
| 6,486,821 B1 | 11/2002 | Aude et al. | |
| 6,958,646 B1 * | 10/2005 | Colleran et al. | 330/9 |
| 2002/0186077 A1 | 12/2002 | Jantzi et al. | |
| 2008/0252376 A1 | 10/2008 | Miao et al. | |

FOREIGN PATENT DOCUMENTS
WO  WO 2008/080213  7/2008

OTHER PUBLICATIONS

P. Bogner, et al., "A high signal swing Class AB earpiece amplifier in 65nm CMOS Technology," 1-4244-0303-4/06 IEEE, pp. 372-375, 2006.
Tan et al., "Analysis of Deep Submicrom CMOS Transistor Vtlin and Idsat versus Channel Width", Asian Pacific Microwave Conference Proceedings, IEEE, 2005.
International Search Report dated May 19, 2010, in counterpart international application No. PCT/US2010/026371.

* cited by examiner

*Primary Examiner* — Robert Pascal
*Assistant Examiner* — Khiem D Nguyen
(74) *Attorney, Agent, or Firm* — Kenyon & Kenyon LLP

(57) ABSTRACT

An embodiment of a multi-path, multi-oxide-thickness amplifier circuit includes a first amplifier having at least one thin-oxide output transistor, and a second amplifier having at least one thick-oxide output transistor. The first and second amplifiers are connected in parallel with each other between an input terminal and an output terminal of the amplifier circuit. The thin-oxide output transistor has a gate-oxide layer thickness that is less than a gate-oxide layer thickness of the thick-oxide output transistor.

20 Claims, 4 Drawing Sheets

US 7,915,959 B2

MULTI-PATH, MULTI-OXIDE-THICKNESS AMPLIFIER CIRCUIT

BACKGROUND INFORMATION

Major trends in integrated circuit design include reduction in power supply voltages and transistor dimensions. The power supply voltage reduction is related to the transistor size reduction, as well as to other measures of circuit performance.

One measure of a transistor that has importance is the thickness of its gate oxide layer. On a basic level, a transistor includes two doped source and drain semiconductor regions spaced apart from each other in a differently doped semiconductor body region. A conducting gate is formed over the portion of the body separating the source and drain.

The gate oxide layer separates the gate from the body portion over which it is formed. The transistor operates, at least in part, by applying a voltage to the gate, which excites a charge state in the body underneath the gate to form a conduction channel.

The gate oxide thickness correlates to performance and operational measures of the transistor. A thinner gate oxide produces a faster device, having a higher bandwidth, or unity-gain frequency $f_T$. A thicker gate oxide produces a slower device, having a lower unity-gain frequency $f_T$. However, a thinner gate oxide also reduces the maximum voltage to which the transistor can be exposed without being damaged, and thus the maximum voltage swing that the transistor can supply in a circuit. A thicker gate oxide, by contrast, can withstand a higher voltage without being damaged, and thus can provide a greater voltage swing. In an exemplary 65 nm minimum-feature-size integrated circuit process, successively greater gate-oxide thicknesses result in transistors capable of operating under maximum power supply voltages (and thus providing correspondingly related output-voltage swings) of 1.0V, 1.8V, 2.5V, and 3.3V, respectively. However, the thickest oxide, capable of providing the greatest output-voltage swing, has a unity-gain frequency $f_T$ that is only one-tenth as great as that of the thinnest-oxide transistor, which has the least output-voltage-swing capability.

The tradeoff between speed and output-voltage swing, as embodied as a result of the performance implications of varying gate-oxide thicknesses, surfaces as a corresponding tradeoff in the design of circuits using transistors. For example, use of thin-oxide transistors in an amplifier results in the amplifier having a high bandwidth, but being capable of only a limited output-voltage swing. By contrast, use of thick-oxide transistors in an amplifier results in the amplifier being capable of a higher output-voltage swing due to its ability to operate under a greater power supply voltage, but also having has a lower bandwidth.

Thus, a need exists to overcome the limitations on amplifier design, and circuit design in general, imposed by this tradeoff between bandwidth and output-voltage swing resulting from transistor properties correlating to gate-oxide thickness.

BRIEF DESCRIPTION OF THE DRAWINGS

So that features of the present invention can be understood, a number of drawings are described below. However, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

An embodiment of a multi-path, multi-oxide-thickness amplifier circuit includes a first amplifier having at least one thin-oxide output transistor, and a second amplifier having at least one thick-oxide output transistor. The first and second amplifiers are connected in parallel with each other between an input terminal and an output terminal of the amplifier circuit, and provide first and second distinct amplification paths, respectively, from the input terminal to the output terminal. Relative to each other, the first amplification path (including the first amplifier) provides a higher bandwidth amplification, and the second amplification path (including the second amplifier) provides a higher output-voltage-swing amplification. The first and second amplification paths are configured in the amplification circuit to not impede each other's ability to contribute high bandwidth or high output-voltage-swing amplification, respectively.

Figure 1:
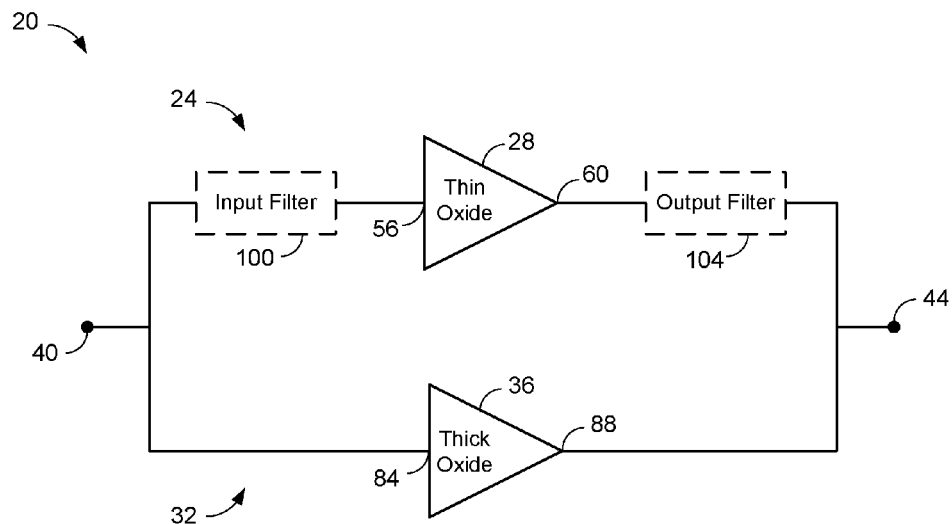
FIG. 1 is a circuit schematic depicting an embodiment of a multi-path, multi-oxide-thickness amplifier circuit.

FIG. 1 depicts an embodiment of the multi-path, multi-oxide-thickness amplifier circuit 20, which includes a first amplification path 24 having a first amplifier 28, and a second amplification path 32 having a second amplifier 36. The first and second amplification paths 24, 32 are distinct signal-amplification paths between an input terminal 40 and an output terminal 44 of the amplifier circuit 20. The first amplification path 24, having the first amplifier 28, provides high-bandwidth amplification for an input signal presented to the input terminal 40 to produce a portion of the output signal at the output terminal 44. The second amplification path 32, having the second amplifier 36, provides large output-voltage-swing amplification for the input signal presented to the input terminal 40 to produce a portion of the output signal at the output terminal 44.

Figure 2:
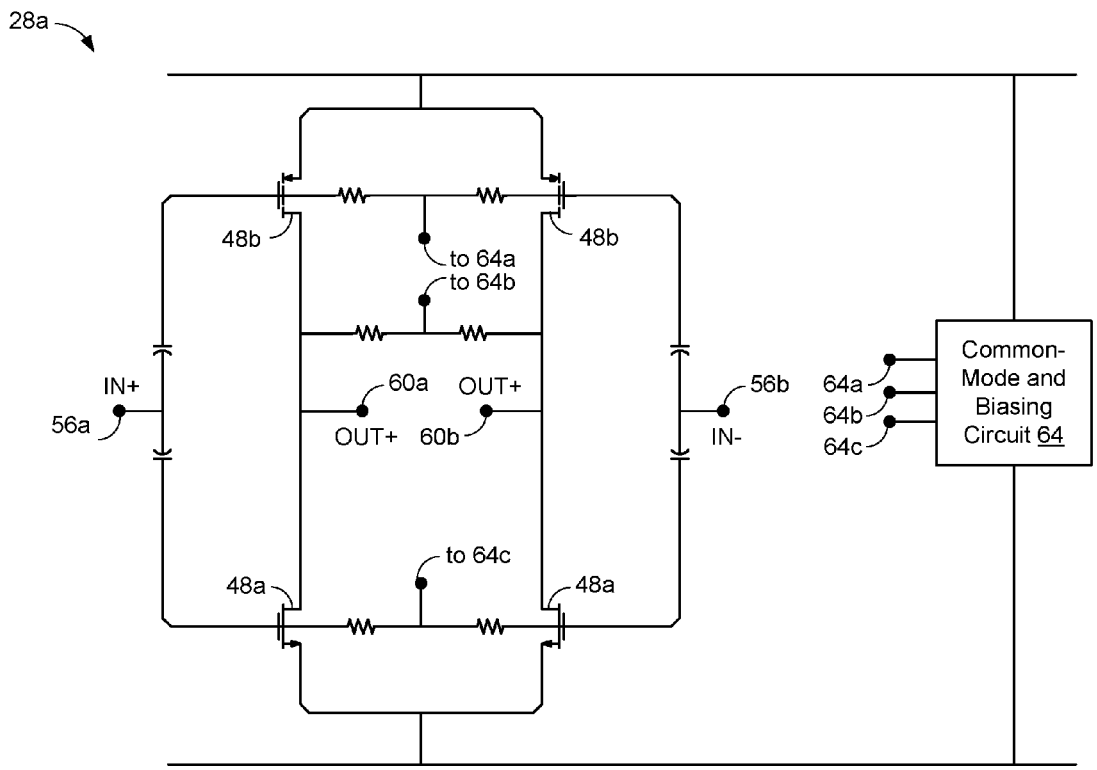
FIG. 2 is a circuit schematic depicting an embodiment of a first amplifier, of the amplifier circuit, having at least one thin-oxide output transistor.

The first amplifier 28 is configured to include a thin-oxide output transistor (e.g., thin-oxide NMOS and PMOS output transistors 48a, 48b shown in FIG. 2). The first amplifier 28 includes at least one, and optionally a plurality, of thin-oxide output transistors. The thin-oxide output transistors of the first amplifier 28 have at least drains connected to an output 60 of the first amplifier 28, and are the only transistors of the first amplifier 28 having drains connected to the output 60 of the first amplifier 28. The first amplifier 28 also includes only thin-oxide transistors throughout. Thus, not only are the output transistors thin-oxide transistors, but all the other transistors of the first amplifier 28 are thin-oxide transistors. The configuration of the first amplifier 28 to have only thin-oxide transistors enables the first amplifier 28 to be a higher-bandwidth amplifier in comparison to a similar amplifier having thick-oxide transistors in a bandwidth-affecting signal path. Because the first amplifier 28 contains no thick-oxide transistors in any signal path, the first amplifier 28 is able to take full advantage of the higher-bandwidth of thin-oxide transistors, and not suffer effects from the lower bandwidth of thick-oxide transistors. Thus, the first amplification path 24 (including the first amplifier 28) is the relatively higher-bandwidth amplification path, at least in comparison to the second amplification path 32, of the amplifier circuit 20.

The first amplifier 28 can have a variety of different circuit configurations while having thin-oxide output transistors and thin-oxide other transistors throughout. The first amplifier 28 can be either a voltage amplifier or a current amplifier. As a voltage amplifier, the first amplifier 28 can be, e.g., an operational amplifier. As a current amplifier, the first amplifier 28 can be, e.g., a transconductor or an operational transconductance amplifier. The first amplifier 28 can also be any of fully single-ended (i.e., receiving a single ended signal at an input 56 and producing a single-ended signal at the output 60), fully differential (i.e., receiving a differential signal at the input 56 and producing a differential signal at the output 60), or partially singled-ended, partially differential (i.e., have a single-ended input 56 and a differential output 60, or have a differential input 56 and a single-ended output 60). The schematic depiction of signal paths in FIG. 1 can represent either single-ended or differential signal paths.

FIG. 2 depicts an exemplary embodiment of the first amplifier 28a. The depicted embodiment implements a fully-differential transconductor, having a differential input 56a, 56b accepting a differential input voltage and a differential output terminal 60a, 60b producing a differential output current, and can potentially be used in a number of different applications that call for transconductors, including Gm-C filter configurations. As indicated above, however, the first amplifier 28 can have a number of different configurations and functional roles. In FIG. 2, the first amplifier 28a includes four thin-oxide output transistors, including two thin-oxide NMOS output transistors 48a and two thin-oxide PMOS output transistors 48b, having drains connected to the differential output terminal 60a, 60b of the first amplifier 28a. The thin-oxide output transistors 48a, 48b have gates coupled to the differential input terminal 56a, 56b of the first amplifier 28a. The first amplifier 28 can also include other circuitry besides the thin-oxide output transistors. In the embodiment of FIG. 2, the first amplifier 28a also includes a plurality of NMOS and PMOS thin-oxide transistors configured in a common-mode and biasing portion 64 of the circuit to provide common-mode and biasing control connections 64a, 64b, 64c to other portions of the first amplifier 28a.

Figure 3A:
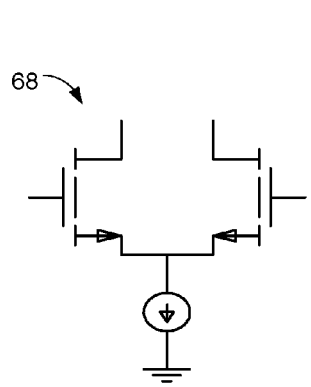
FIGS. 3A, 3B, and 3C are circuit schematics depicting embodiments of a differential pair of NMOS transistors, a pseudo differential pair of NMOS transistors, and a complimentary pseudo differential pair of NMOS and PMOS transistors, which can be used as amplification stages.
Figure 3B:
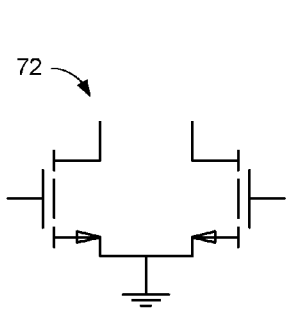
Figure 3C:
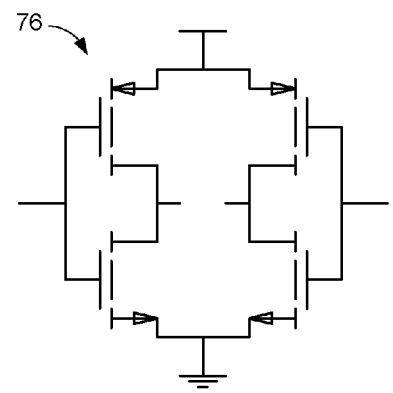

Additionally, although the embodiment of the first amplifier 28a depicted in FIG. 2 effectively includes only a single stage of amplification, the first amplifier 28 can optionally include additional stages of amplification placed between the input terminals 56a, 56b and the output transistors 48a, 48b. FIGS. 3A, 3B, and 3C depict exemplary embodiments of such additional stages of amplification, including, respectively, differential pairs 68 of thin-oxide NMOS transistors (or, alternatively to that shown, thin-oxide PMOS transistors), pseudo differential pairs 72 of thin-oxide NMOS transistors (or, alternatively to that shown, thin-oxide PMOS transistors), or complementary pseudo differential pairs 76 of thin-oxide NMOS and PMOS transistors.

Figure 4:
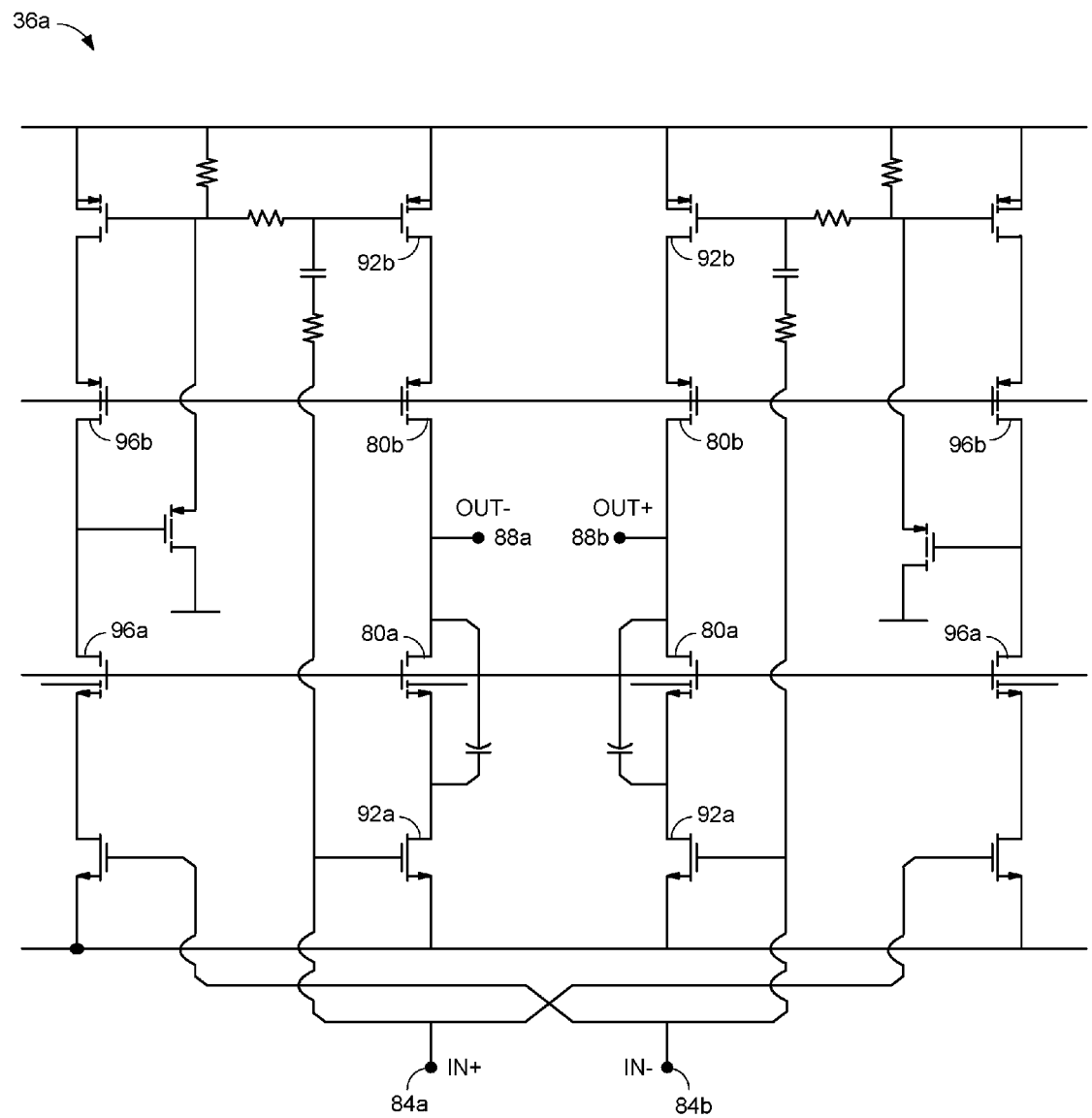
FIG. 4 is a circuit schematic depicting an embodiment of a second amplifier, of the amplifier circuit, having at least one thick-oxide output transistor.

The second amplifier 36 can be configured to include thick-oxide output transistors (e.g., thick-oxide NMOS and PMOS output transistors 80a, 80b shown in FIG. 4). The second amplifier 36 can include at least one, and optionally a plurality of thick-oxide output transistors, and optionally every output transistor of the second amplifier 36 can be a thick-oxide output transistor. The output transistors of the second amplifier 36 have at least drains connected to an output 88 of the second amplifier 36, and are the only transistors of the second amplifier 36 having drains connected to the output 88 of the second amplifier 36. The configuration of the second amplifier 36 to have only thick-oxide output transistors enables the second amplifier 36 to be a relatively high output-voltage-swing amplifier in comparison to a similar amplifier having thin-oxide output transistors. The second amplifier 36 can include either thick- or thin-oxide transistors in remaining portions of the amplifier 36, beside the output transistors, as the design of the amplifier 36 may dictate. For example, to preserve the advantage of the second amplifier 36 being a high output-voltage-swing amplifier, the second amplifier 36 can optionally include thick-oxide transistors at any stage of the amplifier 36 at which amplification of a signal traveling through the amplifier 36 exists to such an extent as to surpass the voltage-withstanding capability of thin-oxide transistors. Thus, the second amplifier 36 can include a selected mix of thick- and thin-oxide transistors, so long as at least the output-transistors are thick-oxide transistors. Thus, the second amplifier 36 is able to take full advantage of the higher output-voltage swing of thick oxide transistors, and not suffer effects from the lower output-voltage swing of thin-oxide transistors. In the multi-path, multi-oxide-thickness amplifier circuit 20, the second amplification path 32 (including the second amplifier 36) is therefore the relatively higher output-voltage-swing amplification path in comparison to the first amplification path 24.

The second amplifier 36, like the first amplifier 28, can have a variety of different circuit configurations while having thick-oxide output transistors as the only output transistors. Similarly as discussed in regard to the first amplifier 28, the second amplifier 36 can be either a voltage amplifier (such as, e.g., an operational amplifier) or a current amplifier (such as, e.g., a transconductor or an operational transconductance amplifier), and can be any of fully single-ended, fully differential, or having a single-ended input and a differential output.

FIG. 4 depicts an exemplary embodiment of the second amplifier 36a. The depicted embodiment implements a fully-differential transconductor, having a differential input terminal 84a, 84b accepting a differential input voltage and a differential output terminal 88a, 88b producing a differential output current. As discussed above, however, the second amplifier 36 can have a number of different configurations and functional roles. In FIG. 4, the second amplifier 36a includes four thick-oxide output transistors, including two thick-oxide NMOS output transistors 80a and two thick-oxide PMOS output transistors 80b, having drains connected to the differential output terminals 88a, 88b of the second amplifier 36a. The thick-oxide output transistors 80a, 80b are the cascodes of, and have sources connected to, four additional transistors, including two NMOS and two PMOS transistors 92a, 92b, which have their gates connected to the differential input terminals 84a, 84b of the second amplifier 36a, and receive a voltage input from the input terminals 84a, 84b and feed a current signal to the thick-oxide output transistors 80a, 80b. In the depicted embodiment, the additional NMOS and PMOS transistors 92*a*, 92*b* in cascode-configuration with the thick-oxide output transistors 80*a*, 80*b* can be selected to be thin-oxide transistors because they are not subjected to the full output-voltage swing of the amplifier 36*a* during its operation. The second amplifier 36 can also include other circuitry besides the thick-oxide output transistors 80*a*, 80*b* and the additional cascode-configuration transistors 92*a*, 92*b*. In the embodiment of FIG. 4, the second amplifier 36*a* also includes a plurality of further NMOS and PMOS transistors configured to provide various biasing, common-mode control, and further amplification during the operation of the depicted fully differential embodiment of the second amplifier 36*a*. Some of the additional transistors of the second amplifier 36*a* can be selected to also be thick-oxide transistors. In FIG. 4, additional transistors 96*a*, 96*b* having their gates connected to the gates of the thick-oxide output transistors 80*a*, 80*b* are also selected to be thick-oxide transistors because they are potentially subject, at least to some degree, to a voltage swing having a magnitude similar or related to the magnitude of the output-voltage swing. All the other transistors, not yet discussed, of embodiment of FIG. 4 are thin-oxide transistors.

Thus, in some embodiments, the second amplifier 36 has several different categories of transistors, including a first category of thick-oxide output transistors (e.g., thick-oxide NMOS and PMOS output transistors 80*a*, 80*b*), a second category of other thick-oxide transistors (e.g., thick-oxide NMOS and PMOS transistors 96*a*, 96*b* having gates connected to the gates of thick-oxide output transistors, or other transistors being subject to a same or similar voltage swing as the output-voltage swing of thick-oxide output transistors), and a third category of thin-oxide transistors (e.g., transistors either not having drains connected to the output terminal 88, not having gates connected to the gates of thick-oxide output transistors, or not being subject to a same or similar voltage swing as the output-voltage of the thick-oxide output transistors; such as cascode-configuration NMOS and PMOS transistors 92*a*, 92*b*).

As with the first amplifier 28, the second amplifier 36 can include further amplification stages as may be desirable for various applications, and thus the second amplifier 36 could be expanded by adding the exemplary embodiments of additional amplification stages depicted in any of FIGS. 3A, 3B, and 3C. When adding additional amplification stages to the second amplifier 36, however, possibly in contrast to the addition of additional amplification stages to the first amplifier 28, the added transistors can potentially be selected to be either thick-oxide or thin-oxide transistors depending on the degree of voltage swing to which they are subjected. Thus, addition of the differential pair 68, the pseudo differential pair 72, or the complementary pseudo differential pair 76, as depicted in FIGS. 3A, 3B, and 3C, respectively, can be selected to be in the form of either thick- or thin-oxide NMOS or PMOS transistors.

Figure 5A:
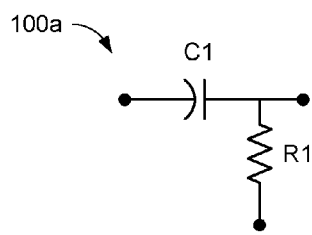
FIGS. 5A and 5B are circuit schematics depicting embodiments of an input filter and an output filter of a first amplification path of the amplifier circuit.

The first amplification path 24 of the multi-path, multi-oxide-thickness amplifier circuit 20 depicted in FIG. 1 also includes an input filter 100 connected between the input terminal 40 of the amplifier circuit 20 and the input 56 of the first amplifier 28, and an output filter 104 connected between the output 60 of the first amplifier 28 and the output terminal 44 of the amplifier circuit 20. The input and output filters 100, 104 of the first amplification path 24 further protect the thin-oxide first amplifier 28 from voltages that can potentially exceed the voltage-withstanding capability of thin-oxide transistors. The input filter 100 can be a high-pass filter that filters out DC voltages, appearing at the input terminal 40 of the amplifier circuit 20, that may exceed the voltage-handling capacity of the thin-oxide transistors. FIG. 5A depicts an exemplary embodiment 100*a* of the input filter 100. In FIG. 5A, the input filter 100*a* includes a capacitor C1 and a resistor R1 configured as an RC combination to provide high pass filtering in a signal-traveling direction from the left to the right in FIG. 5A (i.e., from the input terminal 40 to the input 56 of the first amplifier 28 in the amplifier circuit 20). The AC coupling capacitor C1 prevents DC voltages present at the input terminal 40 of the amplifier circuit 20 from reaching the input 56 of the first amplifier 28, and the resistor R1 can provide a DC bias voltage to the input 56 of the first amplifier 28.

Figure 5B:
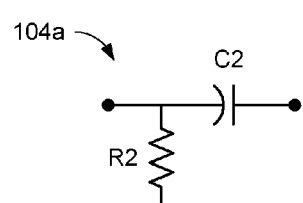

The output filter 104 filters out and prevents DC voltages, which may be present at the output terminal 44 of the amplifier circuit 20, and that may exceed the voltage-handing capacity of the thin-oxide output transistors of the first amplifier 28, from entering the first amplifier 28 through its output 60, by either a feedback mechanism or the mere presence of such voltages at the output terminal 44 of the amplifier circuit 20. The output filter 104 can also be a high-pass filter, when viewed in the signal-travel direction of from the output terminal 44 of the amplifier circuit 20 to the output 60 of the first amplifier 28. FIG. 5B depicts an exemplary embodiment 104*a* of the output filter 104. In FIG. 5B, the output filter 104*a* includes a resistor R2 and a capacitor C2 configured as an RC combination to provide high pass filtering in a signal-traveling direction from the right to the left in FIG. 5B (i.e., from the output terminal 44 to the output 60 of the first amplifier 28 in the amplifier circuit 20).

The input and output filters 100, 104 can be alternatively implemented, and therefore their associated benefits alternatively achieved, in some embodiments of the multi-path, multi-oxide-thickness amplifier circuit 20. The input and output filters 100, 104 can be alternatively implemented through the re-use of parasitic or inherent capacitances and resistances of circuit elements of the first amplifier 28 connected to the input and output 56, 60 of the first amplifier 28. For example, the resistor R2 of the output filter 104 can optionally, instead of being a distinct resistor in its own right, be implemented by the output resistance of the output transistors of the first amplifier 28, and in such cases a separate resistor of the output filter 104, distinct from the first amplifier 28, is not needed.

The input filter 100 can optionally be omitted, and instead one can prevent the presence of relatively large voltage magnitudes at the input terminal 40 of the amplifier circuit 20 through circuit and system design choices.

The multi-path, multi-oxide-thickness amplifier circuit 20 can also include parallel amplification paths in addition to the first and second amplification paths 24, 32 (having the first and second amplifiers 28, 36). In general, the amplifier circuit 20 can include a plurality of amplification paths, each having an amplifier that includes output transistors having a different oxide thickness than the other amplifiers of the other amplification paths. Thus, each amplifier (and corresponding amplification path) can achieve a different combination of bandwidth and output-voltage swing capability. Such an embodiment can be tailored to very precisely meet gain (as related to the achieved bandwidth) and output-voltage swings over a broad range of operational frequencies for any given application.

Figure 6:
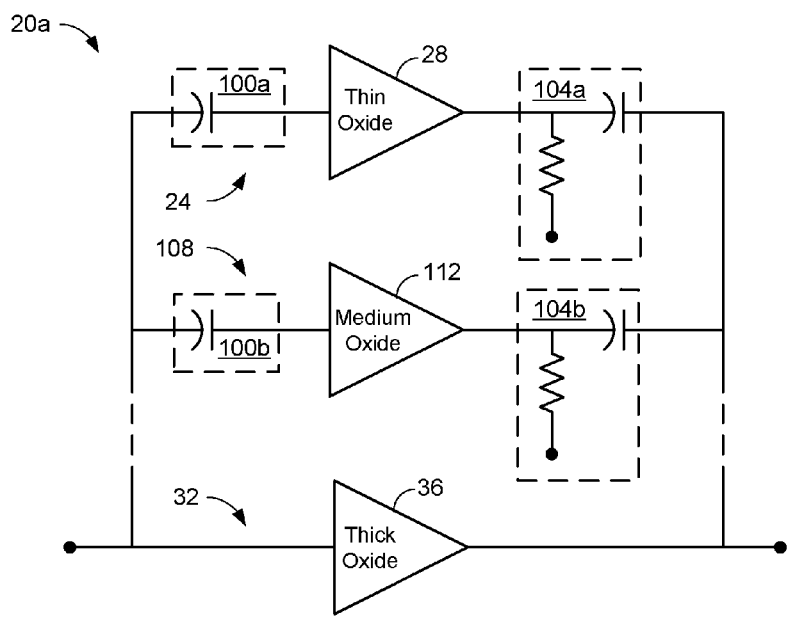
FIG. 6 is a circuit schematic depicting another embodiment of the amplifier circuit.

FIG. 6 depicts one embodiment of the multi-path, multi-oxide-thickness amplifier circuit 20*a* having the plurality of parallel amplification paths and amplifiers. The depicted embodiment includes at least three separate amplification paths 24, 32, 108 and corresponding amplifiers 28, 36, 112, but, as the dashed-line portion of the schematic indicates, additional amplification paths and corresponding amplifiers can also be included. In addition to the first amplification path 24 having the first amplifier 28 (which includes only thin-oxide output transistors and thin-oxide other transistors), and the second amplification path 32 having the second amplifier 36 (which includes thick-oxide output transistors), the embodiment of FIG. 6 includes at least a third amplification path 108 having a third amplifier 112, which includes medium-oxide output transistors having a medium oxide-thickness (in comparison to the thin and thick oxide thicknesses). The third amplifier 112 can include medium-oxide output transistors, and other medium-oxide-thickness transistors as well as thin-oxide transistors configured according to a similar methodology to that discussed in regard to the placement of thick-oxide transistors in the second amplifier 36. For example, in the depicted embodiment, every output transistor of the third amplifier 112 is a medium-oxide thickness transistor, and any other transistor in the third amplifier that needs to withstand a medium-level voltage swing can be selected to be a medium-oxide transistor, etc. Relative to the first amplifier 28, the third amplifier 112 can withstand a higher output-voltage swing, but has a reduced bandwidth. Relative to the second amplifier 36, the third amplifier 112 can only withstand a reduced output-voltage swing, but has a greater bandwidth.

Figure 7:
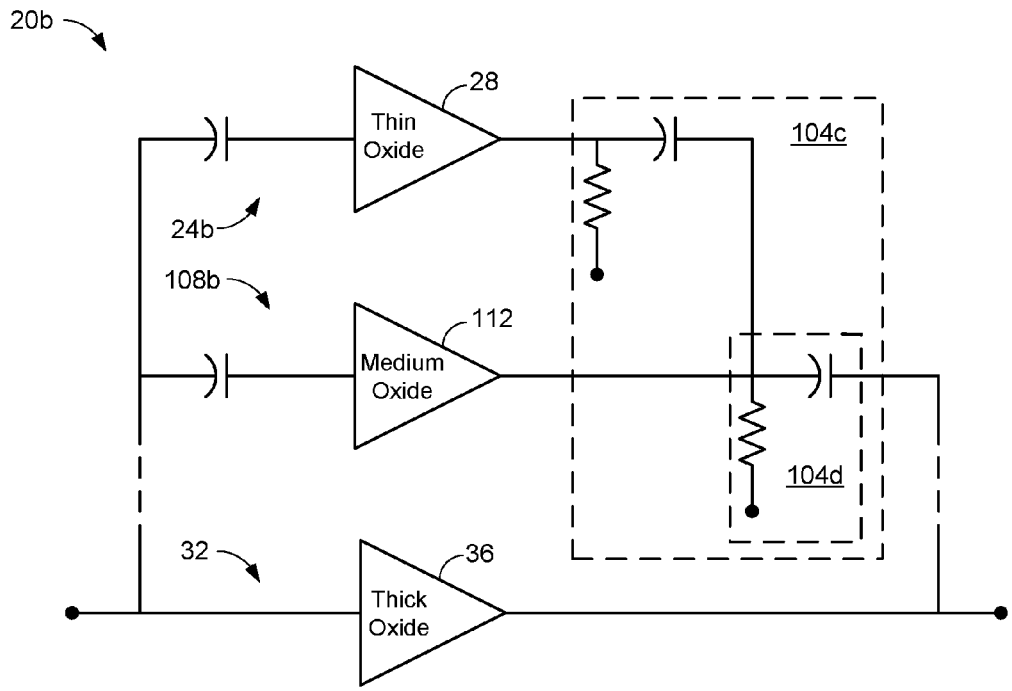
FIG. 7 is a circuit schematic depicting another embodiment of the amplifier circuit.

In FIG. 6, the first and third amplification paths 24, 108 include input and output filters 100a, 100b, 104a, 104b. (As discussed above, however, in other embodiments, input filters 100 can be omitted, and output filters 104 can be implemented at least in part through re-use of amplifier output resistances.) In FIG. 6, the input and output filters 100b, 104b of the third amplification path 108 are arranged similarly to those of the first amplification path 24. Further, in the depicted embodiment, the input and output filters 100b, 104b of the third amplification path 108 have the same general configuration as shown in the exemplary embodiments of FIGS. 5A and 5B, although it is possible to vary the actual resistance and capacitance values as appropriate to achieve desired bandwidth properties for the third amplification path 108. However, as also similarly discussed above in regard to the first amplification path 24, the input and output filters 100b, 104b of the third amplification path 108 can take a variety of forms. Additionally, the interconnection of the plurality of parallel amplification paths can be adjusted from that shown in FIG. 6 to that of another exemplary embodiment of the amplifier circuit 20b depicted in FIG. 7. In FIG. 7, the interconnection of the first and third amplification paths 24b, 108b occurs in such a way as to effectively re-use portions of the output filter 104d of the third amplification path 108b as part of the output filter 104c of the first amplification path 24b. That is, the staggered interconnection depicted in FIG. 7 enables a potentially more advantageous selection of resistance and capacitance values (i.e., potentially physically smaller and occupying less chip area) for the output filters 104c, 104d of the first and third amplification paths 24b, 108b.

Figure 8A:
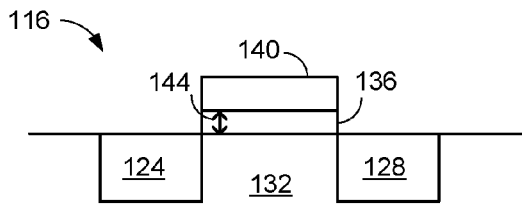
FIGS. 8A and 8B are cross-sectional views of embodiments of thin- and thick-oxide transistors, respectively.
Figure 8B:
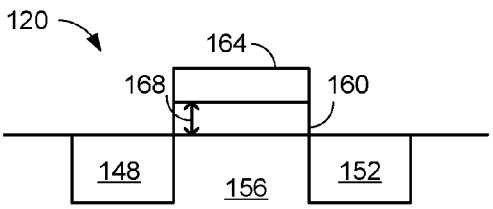

FIGS. 8A and 8B are simplified cross-sectional depictions of exemplary embodiments of thin- and thick-oxide transistors 116, 120, respectively, suitable for use in the multi-path, multi-oxide thickness amplifier circuit 20 wherever thin- and thick-oxide transistors are used (i.e., as thin-oxide output transistors, thin-oxide other transistors, thick-oxide output transistors, thick-oxide other transistors, etc.). FIG. 8A depicts an exemplary embodiment of an NMOS thin-oxide transistor 116 having N-type drain and source regions 124, 128 formed in a p-type body region 132. The depicted thin-oxide transistor 116 includes a gate-oxide layer 136 separating a gate 140 from the body 132, over the region of the body 132 that becomes a conducting channel during circuit operation. The gate-oxide layer 136 has a first gate-oxide thickness 144. The gate-oxide thickness 144 of the thin-oxide transistor 116 is typically the thinnest gate oxide formed on a particular chip, or capable of being formed by a particular integrated circuit process. FIG. 8B depicts an exemplary embodiment of an NMOS thick-oxide transistor 120 having N-type drain and source regions 148, 152 formed in a p-type body region 156. The depicted thick-oxide transistor 120 includes a gate-oxide layer 160 separating a gate 164 from the body 156 over the region of the body 156 that becomes a conducting channel during circuit operation. The gate-oxide layer 160 has a second gate-oxide thickness 168. The second gate-oxide thickness 168 of the thick-oxide transistor 120 is at least greater than the first gate-oxide thickness 144 of the thin-oxide transistor 116 depicted in FIG. 8A. In some embodiments, the second gate-oxide thickness 168 can be substantially greater than the first gate-oxide thickness 144. For example, the second gate-oxide thickness 168 can optionally be either one-and-a-half or twice as great as the first gate-oxide thickness 144. Other ratios of the second 168 to first gate-oxide thicknesses 144 are also possible. Furthermore, in an embodiment including at least three amplification paths having amplifiers including, respectively, thin-, medium- and thick-oxide transistors, each level of gate-oxide thickness can be at least greater than the preceding level of gate-oxide thickness. The different levels of gate-oxide thicknesses can also be related to each other by gate-oxide thickness ratios, such as one-and-a-half to one, or two to one, for successively thicker gate-oxide layers (e.g., a medium-to-thin ratio, and a thick-to-medium ratio having these exemplary values).

Figure 9:
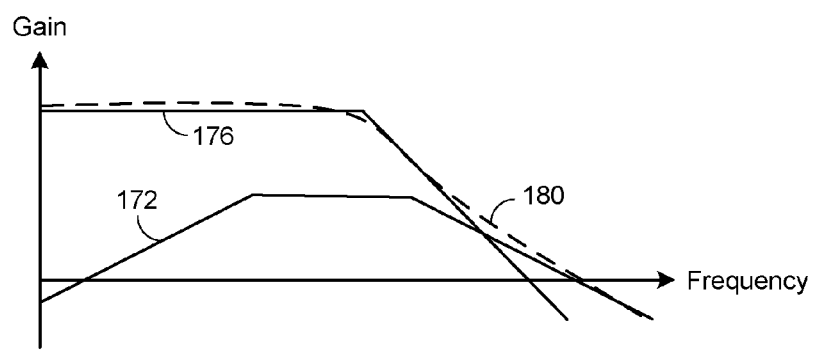
FIG. 9 is a graph depicting embodiments of the frequency response of the first amplifier, the second amplifier, and the amplifier circuit (having the first and second amplifiers).

FIG. 9 depicts an exemplary embodiment of frequency responses (i.e., gain plotted as a function of frequency) of the first amplifier individually 172, the second amplifier individually 176, and the multi-path, multi-oxide-thickness amplifier circuit altogether 180. In FIG. 9, the first amplifier 28 can contribute to the overall amplifier circuit frequency response 180 at higher frequencies to a greater degree than the second amplifier 36, and, conversely, the second amplifier 36 can contribute to the overall amplifier circuit frequency response 180 at lower frequencies to a greater degree than the first amplifier 28. In one embodiment, this differing contribution to the overall frequency response 180 of the amplifier circuit 20 by the first and second amplifier circuits 28, 36 can be used advantageously to allow for relaxing of the stability requirements of the second amplifier 36. Thus, the second amplifier 36 can optionally be designed to be unstable by itself (thus relaxing various design burdens), but be included in a combination with the first amplifier 28 than produces and embodiment of the multi-path, multi-oxide-thickness amplifier circuit 20 that is stable collectively. This can allow the second amplifier 36 to be designed to have a wider bandwidth than would otherwise be possible if it was required that the second amplifier 36 be stable on its own.

In operation, the multi-path, multi-oxide thickness amplifier circuit 20 can be configured to receive different power supply voltages, and to provide the different power supply voltages to different internal portions of the amplifier circuit 20. For example, the amplifier circuit can be configured to receive a first, lower power supply voltage and provide that first power supply voltage to portions of the amplifier circuit having either thin- or thick-oxide output transistors, as well as receive a second, higher power supply voltage and provide that second power supply voltage to portions of the amplifier circuit 20 having only thick-oxide output transistors. This concept can also be extended to embodiments of the amplifier circuit 20 having more than two parallel amplification paths, such as the embodiments depicted in FIGS. 6 and 7. In such embodiments, three or more power supply voltages can be received by the amplifier circuit 20 and delivered to portions of the amplifier circuit according to a matching of increasing power supply voltage levels to increasing gate-oxide thickness.

Other embodiments of the multi-path, multi-oxide-thickness amplifier circuit 20 are also possible. For example, aspects and components of various embodiments described herein can also be combined and mixed with each other to create new embodiments of the amplifier circuit.

What is claimed is:

1. An amplifier circuit, comprising:
   a first amplifier having at least one thin-oxide output transistor;
   an output filter connected between the first amplifier and a common output terminal, wherein the output filter implements high-pass filtering from the output terminal to an output of the first amplifier and includes a capacitor connected between the output terminal and the output of the first amplifier; and
   a second amplifier having at least one thick-oxide output transistor;
   wherein the first and second amplifiers are respectively included in first and second parallel amplification paths connected between a common input terminal and the common output terminal, and the thin-oxide output transistor has a gate-oxide layer thickness that is less than a gate-oxide layer thickness of the thick-oxide output transistor.

2. The amplifier circuit of claim 1, wherein the gate-oxide layer thickness of the thin-oxide output transistor is less than one-half the gate-oxide layer thickness of the thick-oxide output transistor.

3. The amplifier circuit of claim 1, wherein the first amplifier is configured to receive and provide a first power supply voltage to a circuit branch containing the at least one thin-oxide output transistor, the second amplifier is configured to receive and provide a second power supply voltage to a circuit branch containing the at least one thick-oxide output transistor, and wherein the first power supply voltage is less than the second power supply voltage.

4. The amplifier circuit of claim 1, wherein every output transistor of the first amplifier is a thin-oxide transistor and has a drain connected to an output of the first amplifier; and
   wherein every output transistor of the second amplifier is a thick-oxide output transistor and has a drain connected to an output of the second amplifier.

5. The amplifier circuit of claim 1, wherein every transistor of the first amplifier is a thin-oxide transistor.

6. The amplifier circuit of claim 1, wherein the second amplifier contains at least one thin-oxide transistor.

7. The amplifier circuit of claim 1, further comprising an input filter connected between the input terminal and the first amplifier, wherein the input filter implements high-pass filtering from the input terminal to the first amplifier, and includes a capacitor connected between the input terminal and an input of the first amplifier.

8. The amplifier circuit of claim 1, wherein the first and second amplifiers are at least one type of amplifier selected from the group consisting of a voltage amplifier, an operational amplifier, a current amplifier, a transconductor, and an operational transconductance amplifier.

9. The amplifier circuit of claim 1, wherein the first and second amplifiers are at least one type of amplifier selected from the group consisting of a fully single-ended amplifier, a fully differential amplifier, a single-ended-input differential-output amplifier, and a differential-input single-ended-output amplifier.

10. The amplifier circuit of claim 1, wherein the second amplifier is configured to be unstable if operated by itself, and the parallel combination of the first and second amplifiers is configured to be stable.

11. An amplifier circuit, comprising:
    a first amplifier having at least one thin-oxide output transistor;
    a second amplifier having at least one thick-oxide output transistor, wherein the first and second amplifiers are respectively included in first and second parallel amplification paths between a common input terminal and an common output terminal, and the thin-oxide output transistor has a gate-oxide layer thickness that is less than a gate-oxide layer thickness of the thick-oxide output transistor; and
    a third amplifier having at least one medium-oxide output transistor, wherein the third amplifier is included in a third amplification path connected in parallel with the first and second amplification paths between the input and output terminals, and the medium-oxide output transistor has a gate-oxide layer thickness greater than a gate-oxide layer thickness of the thin-oxide output transistor and less than a gate-oxide layer thickness of the thick-oxide output transistor.

12. The amplifier circuit of claim 11, wherein the gate-oxide layer thickness of the medium-oxide output transistor is less than one-half the gate-oxide layer thickness of the thick-oxide output transistor, and the gate-oxide layer thickness of the thin-oxide output transistor is less than one-half the gate-oxide layer thickness of the medium-oxide output transistor.

13. An amplifier circuit, comprising:
    a first amplifier having at least one thin-oxide output transistor and at least one other signal-path amplifying thin-oxide transistor; and
    a second amplifier having at least one thick-oxide output transistor and at least one signal-path amplifying thin-oxide transistor that does not have its drain directly connected to an output of the second amplifier and does not have its gate connected to a gate of the at least one thick-oxide output transistor;
    wherein the first and second amplifiers are respectively included in first and second parallel amplification paths connected between a common input terminal and an common output terminal.

14. The amplifier circuit of claim 13, wherein the thin-oxide output transistor has a gate-oxide layer thickness that is less than a gate-oxide layer thickness of the thick-oxide output transistor.

15. The amplifier circuit of claim 14, wherein the gate-oxide layer thickness of the thin-oxide output transistor is less than one-half the gate-oxide layer thickness of the thick-oxide output transistor.

16. An amplifier circuit, comprising:
    a first amplifier including at least one thin-oxide output transistor and at least one other signal-path amplifying thin-oxide transistor;
    a second amplifier including at least one thick-oxide output transistor and at least one signal-path amplifying thin-oxide transistor that does not have its drain connected to an output of the second amplifier and does not have its gate connected to a gate of the at least one thick-oxide output transistor, wherein the first and second amplifiers are respectively included in first and second parallel amplification paths connected between a common input terminal and a common output terminal; and a third amplifier having at least one medium-oxide output transistor, wherein the third amplifier is included in a third amplification path connected in parallel with the first and second amplification paths between the input and output terminals, wherein the medium-oxide output transistor has a gate-oxide layer thickness greater than a gate-oxide layer thickness of the thin-oxide output transistor and less than a gate-oxide layer thickness of the thick-oxide output transistor.

17. An amplifier circuit, comprising:

a first amplifier having a plurality of thin-oxide output transistors; and a second amplifier having a plurality of thick-oxide output transistors, wherein the first and second amplifiers are respectively included in first and second parallel amplification paths connected between a common input terminal and an common output terminal, and the thin-oxide output transistors have gate-oxide layer thicknesses that are less than gate-oxide layer thicknesses of the thick-oxide output transistors.

18. The amplifier circuit of claim 17, wherein the first amplifier provides higher-bandwidth amplification than the second amplifier, and the second amplifier provides a higher output-voltage swing than the first amplifier.

19. The amplifier circuit of claim 17, wherein the first amplifier is configured to receive and provide to the thin-oxide output transistors a first supply voltage, the second amplifier is configured to receive and provide to the thick-oxide output transistors a second supply voltage, and the second supply voltage has a greater magnitude than the first supply voltage.

20. The amplifier circuit of claim 17, further comprising an output filter connected between the first amplifier and the output terminal, wherein the output filter implements high-pass filtering from the output terminal to an output of the first amplifier, and includes a capacitor connected between the output terminal and the output of the first amplifier.

* * * * *